United States Patent
Kim et al.

(10) Patent No.: US 7,889,807 B2
(45) Date of Patent: Feb. 15, 2011

(54) SCALABLE VLSI ARCHITECTURE FOR K-BEST BREADTH-FIRST DECODING

(75) Inventors: Hun-Seok Kim, Los Angeles, CA (US); Seok-Jun Lee, Allen, TX (US); Manish Goel, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 884 days.

(21) Appl. No.: 11/756,408

(22) Filed: May 31, 2007

(65) Prior Publication Data

US 2008/0298478 A1     Dec. 4, 2008

(51) Int. Cl.
    *H04B 7/02*     (2006.01)
(52) U.S. Cl. .................................. 375/267; 375/259
(58) Field of Classification Search .................. 375/260
    See application file for complete search history.

(56) References Cited

U.S. PATENT DOCUMENTS

| | | | | |
|---|---|---|---|---|
| 5,901,182 | A * | 5/1999 | Kot | 375/341 |
| 6,490,327 | B1 * | 12/2002 | Shah | 375/341 |
| 7,590,195 | B2 * | 9/2009 | Wang et al. | 375/340 |
| 2006/0251181 | A1 * | 11/2006 | Shashidhar et al. | 375/262 |
| 2006/0256888 | A1 * | 11/2006 | Nissani (Nissensohn) | 375/267 |
| 2007/0162827 | A1 * | 7/2007 | Walton et al. | 714/774 |
| 2008/0049863 | A1 * | 2/2008 | Heiskala | 375/267 |
| 2008/0181339 | A1 * | 7/2008 | Chen et al. | 375/341 |
| 2008/0232455 | A1 * | 9/2008 | Abou Rjeily | 375/233 |
| 2008/0240272 | A1 * | 10/2008 | Waters et al. | 375/260 |
| 2008/0285664 | A1 * | 11/2008 | Wallace et al. | 375/260 |
| 2008/0298478 | A1 * | 12/2008 | Kim et al. | 375/260 |
| 2008/0298493 | A1 * | 12/2008 | Kim et al. | 375/261 |
| 2009/0190676 | A1 * | 7/2009 | Nissani (Nissensohn) | 375/260 |
| 2009/0252248 | A1 * | 10/2009 | Ghosh et al. | 375/267 |

(Continued)

OTHER PUBLICATIONS

Kwan-wai Wong, Chi-ying Tsui, Roger Shu-kwan Cheng, and Wai-ho Mow, "A VLSI Architecture of a K-Best Lattice Decoding Algorithm for MIMO Channels," in IEEE International Symposium on Circuits and Systems (ISCAS), vol. 3, pp. III-273-III-276, May 2002.

(Continued)

*Primary Examiner*—Chieh M Fan
*Assistant Examiner*—Santiago Garcia
(74) *Attorney, Agent, or Firm*—Steven A. Shaw; W. James Brady; Frederick J. Telecky, Jr.

(57) ABSTRACT

In some embodiments, a device includes a multiple-input multiple-output ("MIMO") decoder module coupled to a first log-likelihood-ratio ("LLR") computing unit. The decoder module includes at least one processing unit and at least one sorting unit. The decoder module preferably uses a K-best breadth-first search method to decode data from MIMO sources. In some embodiments, a method includes receiving data representing a vector of receive signal samples detected by multiple receive transceivers. The method further includes performing a K-best breadth-first search on the data to obtain an estimated constellation point. The method further includes providing a user data stream based at least in part on the estimated constellation point.

17 Claims, 7 Drawing Sheets

U.S. PATENT DOCUMENTS

2009/0304114 A1* 12/2009 Burg .......................... 375/340
2010/0054372 A1* 3/2010 Eckert ........................ 375/340
2010/0054374 A1* 3/2010 Larsson et al. .............. 375/341

OTHER PUBLICATIONS

Sungho, Lee, et al. "Reduced Complexity K-Best Lattice Decoding Algorithm for MIMO Systems", Journal of the Institute of Electronics Engineers of Korea, vol. 43-TC, No. 3 Mar. 2006, pp. 344-351.

PCT/US2008/065585 Search Report mailed Nov. 6, 2008.

Burg, Andreas et al., "VLSI Implementation of MIMO Detection Using the Sphere Decoding Algorithm," IEEE Journal Of Solid-State Circuits, vol. 40, No. 7, Jul. 2005, pp. 1566-1577.

Guo, Zhan et al., "A VLSI Architecture of the Schnorr-Euchner Decoder for MIMO Systems," IEEE 6th CAS Symp. on Emerging Technologies: Mobile and Wireless Comm., Shnaghai, China, May 31-Jun. 2, 2004, pp. 65-68.

* cited by examiner

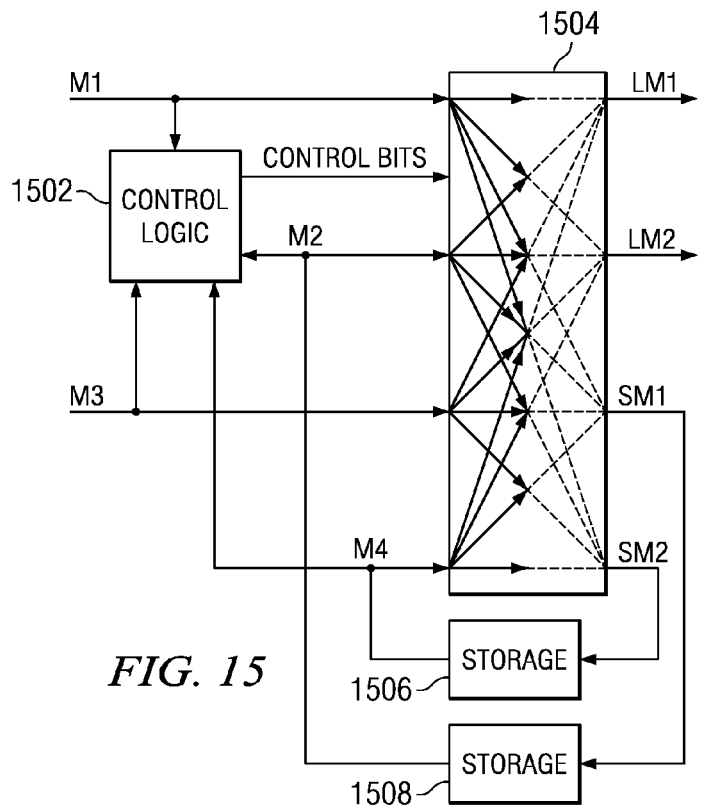
FIG. 15
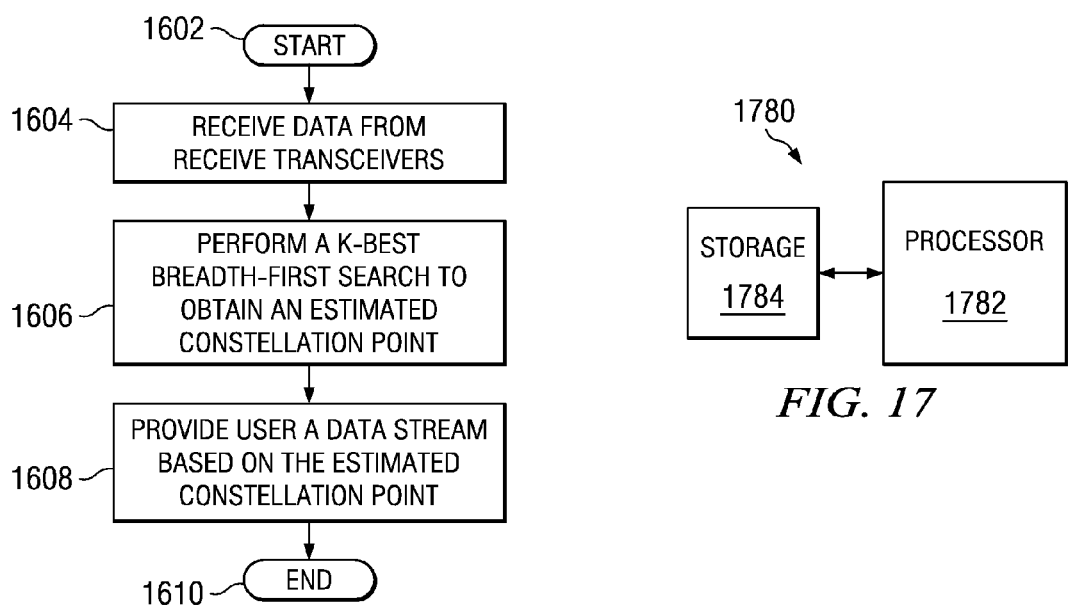
FIG. 16
FIG. 17

SCALABLE VLSI ARCHITECTURE FOR K-BEST BREADTH-FIRST DECODING

BACKGROUND

As wireless technology provides faster and more inexpensive devices, it enables people to be more mobile. Such mobility is desirable to many because it enables better collaboration and more efficient transactions.

To improve the performance of wireless devices, and hence improve mobility, designers are turning to the use of multiple-input multiple-output ("MIMO") systems. MIMO systems have more than one transmitter and more than one receiver, and hence, more than one wireless channel. Such systems work well with existing orthogonal frequency-division multiplexing ("OFDM") methods of transmission because the orthogonal nature of the carriers helps to prevent interference between the adjacent carriers.

At any given frequency, channel output y is related to channel input s by a matrix H such that:

$$y = Hs + n, \qquad (1)$$

where s, y and n are vectors. The input vector s has $M_T$ elements and the output vector y and noise vector n has $M_R$ elements. $M_T$ and $M_R$ are the number of transmit and receive transceivers, respectively. Input vector s is a member of a signal constellation having $M_T$-dimensions ($\Omega^{M_T}$). Because of this dimensionality, the decoding problem may become computationally demanding. For example, an algorithm to decode y in order to determine which constellation point ŝ was sent over the wireless channel requires solving the equation $$\hat{s} = \underset{s \in \Omega^{M_T}}{\arg\min} \|y - Hs\|^2. \qquad (2)$$

This problem has complexity that grows exponentially with the number of transmit transceivers $M_T$. For instance, with 4 transmit transceivers ($M_T=4$) using 16-QAM, there are in each symbol interval $16^4$ or 65,536 constellation points in each frequency bin to be searched in order to locate the signal. Any reduction in this complexity would be advantageous.

SUMMARY

The problem outlined above may at least in part be addressed by K-best breadth-first decoding methods and devices that employ such methods. In some embodiments, a device includes a multiple-input multiple-output ("MIMO") decoder module coupled to a first log-likelihood-ratio ("LLR") computing unit. The decoder module includes at least one processing unit and at least one sorting unit. The decoder module preferably uses a K-best breadth-first search method to decode data from MIMO sources.

In some embodiments, a method includes receiving data representing a vector of receive signal samples detected by multiple receive transceivers. The method further includes performing a K-best breadth-first search on the data to obtain an estimated constellation point. The method further includes providing a user data stream based at least in part on the estimated constellation point.

In some embodiments, a mobile device includes a MIMO decoder. The MIMO decoder is preferably configured to perform a K-best breadth-first search as part of converting a receive signal into a data stream provided to a user.

BRIEF DESCRIPTION OF THE DRAWINGS

For a more complete understanding of the present disclosure and the advantages thereof, reference is now made to the accompanying drawings and detailed description, wherein like reference numerals represent like parts:

FIG. 15 illustrates a high-speed double-input sorting unit in accordance with some embodiments of the present disclosure;

FIG. 16 is a flow diagram illustrating a method in accordance with some embodiments of the present disclosure; and FIG. 17 illustrates a general purpose computer system suitable for implementing some embodiments of the present disclosure.

DETAILED DESCRIPTION

It should be understood at the outset that although an illustrative implementation appears below, the present system may be implemented using any number of techniques whether currently known or later developed. The present disclosure should in no way be limited to the illustrative implementations, drawings, and techniques illustrated below, but may be modified within the scope of the appended claims along with their full scope of equivalents.

Certain terms are used throughout the following claims and discussion to refer to particular system components. This document does not intend to distinguish between components that differ in name but not function. In the following discussion and in the claims, the terms "including" and "comprising" are used in an open-ended fashion, and thus should be interpreted to mean "including but not limited to". Also, the term "couple" or "couples" is intended to mean either an indirect or direct electrical connection. Thus, if a first device couples to a second device, that connection may be through a direct electrical connection, or through an indirect electrical connection via other devices and connections. Additionally, the term "system" refers to a collection of two or more hardware components, and may be used to refer to an electronic device or circuit, or a portion of an electronic device or circuit.

Figure 1:
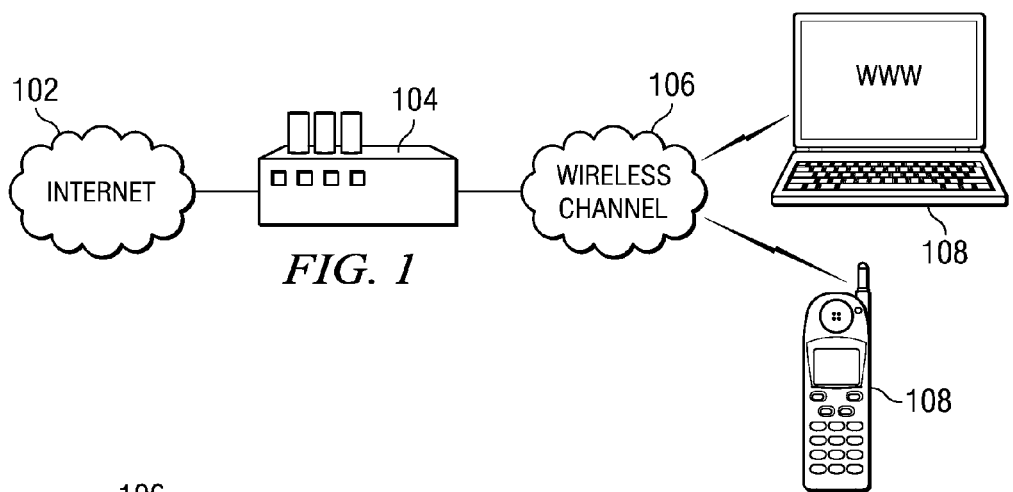
FIG. 1 illustrates a wireless channel transmission in accordance with some embodiments of the present disclosure.

FIG. 1 illustrates an example of a wireless channel transmission: a wireless Internet connection. A combination modem/router 104 serves as a wireless access node to support a wireless channel 106 through which wireless devices 108 access the Internet 102. In some embodiments, the wireless device 108 comprises a computer. In other embodiments, the wireless device 108 comprises a personal digital assistant (PDA), cellular phone, etc. In some embodiments, the wireless device 108 is mobile (e.g., a notebook computer).

Figure 2:
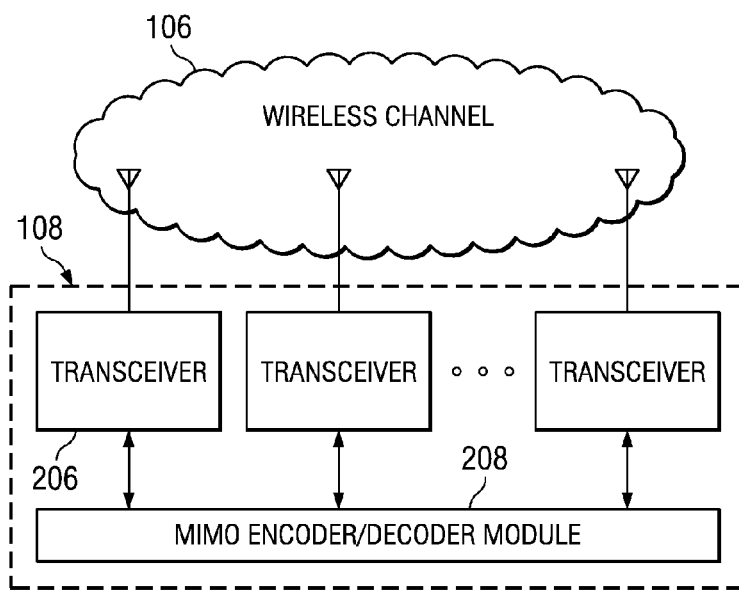
FIG. 2 illustrates a wireless multiple-input multiple-output ("MIMO") interface in accordance with some embodiments of the present disclosure.

FIG. 2 illustrates how a wireless device 108 interfaces with the wireless channel 106. Transceiver input/output sources 206 send and receive data over the wireless channel 106, and couple to a multiple-input multiple-output ("MIMO") encoder/decoder module 208, where received data are decoded or data to be transmitted are encoded, preferably using orthogonal frequency-division multiplexing ("OFDM") encoding techniques.

Figure 3:
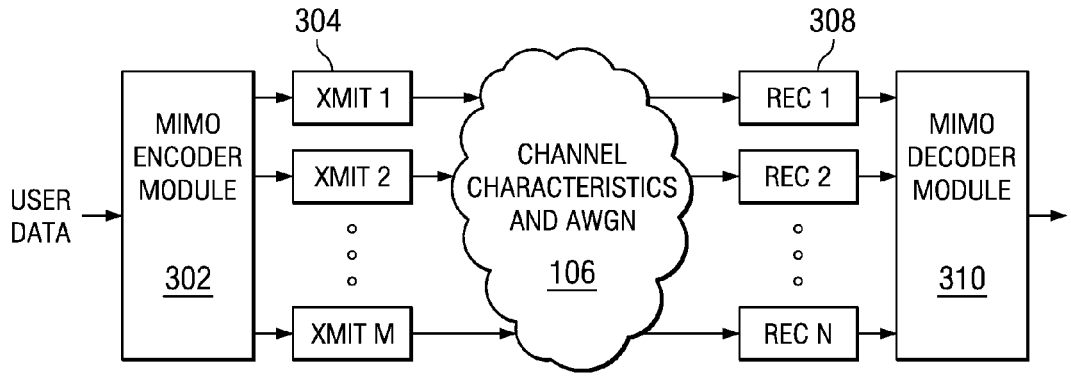
FIG. 3 illustrates data flow through a MIMO system in accordance with some embodiments of the present disclosure.

FIG. 3 illustrates how data flows through a MIMO system. Some elements of FIG. 3 will be elaborated upon in the discussion of subsequent figures. Assuming OFDM using 16 quadrature amplitude modulation ("QAM") modulation, MIMO encoder module 302 uses the data to be transmitted to modulate the amplitudes of two carrier waves, which are out of phase by 90° with respect to each other. Next, the modulated data is transmitted through transmit transceivers 304. At this point, the data is referred to as the transmitted signal or the transmitted symbol. As the transmitted signal passes through the wireless channel 106 it is altered by the transmission characteristics of the channel. The transmitted signal is also altered by noise. This noise is assumed to be additive, white, and Gaussian. Thus, the signal received by the receive transceivers 308 generally appears quite different than the signal sent by the transmit transceivers 304. This altered signal is referred to as the receive signal, and is provided to a MIMO decoder module 310.

In an alternative embodiment, a different method of modulation or combination of modulation methods is used such as phase shift keying, amplitude shift keying, frequency shift keying, minimum shift keying, 64-QAM, etc.

Figure 4:
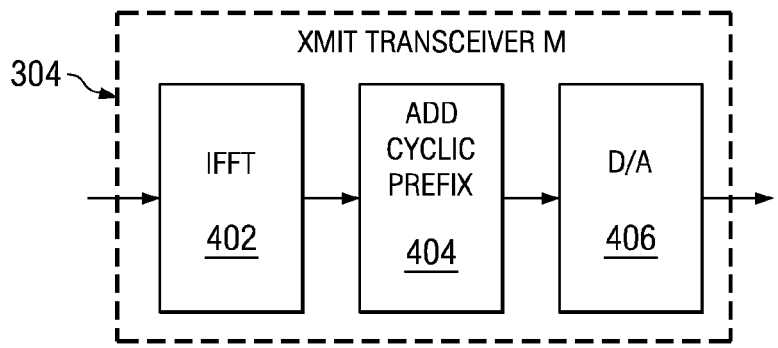
FIG. 4 is a block diagram of a transmit transceiver in accordance with some embodiments of the present disclosure.

FIG. 4 is a block diagram of a transmit transceiver 304. First, data to be transmitted is transformed using an inverse fast Fourier transformation ("IFFT") 402. Next, a cyclic prefix is added to the data 404. Finally, the data is converted from digital to analog form ("D/A") 406 in preparation for transmission.

Figure 5:
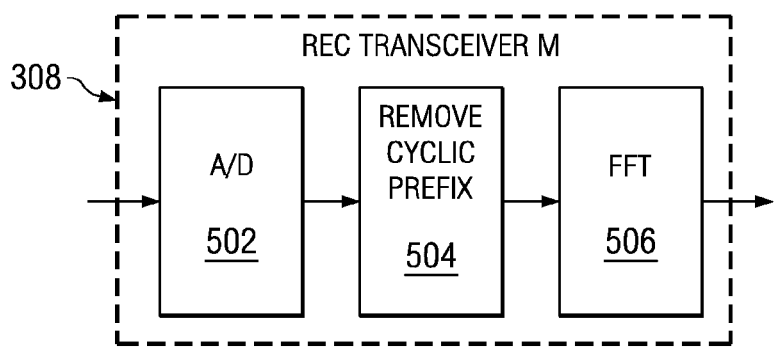
FIG. 5 is a block diagram of a receive transceiver in accordance with some embodiments of the present disclosure.

FIG. 5 is a block diagram of a receive transceiver. First, the received data is converted from analog to digital form ("A/D") 502. Next, the cyclic prefix is removed from the data 504. Finally, the data is transformed using a fast Fourier transformation 506.

Before considering the MIMO decoder module 310, a discussion of decoding may be helpful. Decoding is the idea of estimating the transmit signal most probably sent by transmit transceivers 304 based on the signal received by receive transceivers 308. Considering a mapping of the entire constellation of possibly transmitted signals onto a coordinate system, a similarly mapped received signal will not be located exactly on the transmitted signal, as expected, because of the alteration described in the discussion of FIG. 3. The received signal will be located somewhere in between all the possibly transmitted signals.

Our task is to identify which of the possibly transmitted signals was actually sent based on the received signal. If we assume that the possibly transmitted signal closest to the received signal is the signal actually sent, a logical approach would be to calculate and store the distances between the received signal and each possibly transmitted signal. We could then compare all the stored distances, and select the possibly transmitted signal corresponding to the minimum distance as the signal actually sent. However, the complexity of such an approach soon becomes unmanageable, as discussed above. One way to circumvent the complexity is to exclude possibly transmitted signals which must be farther away than others without calculating or storing the distance for the excluded signals. However, how do we know certain points are farther away from others in the mapping without calculating their distances?

The answer lies in the idea of partial Euclidean distances, or metrics. If we build a node tree such that each node corresponds to one possibly transmitted signal, the number of levels equals twice the number of transmit transceivers, and the levels alternate between representing real and complex values, we may uniquely describe the distance to a possibly transmitted signal as the vector s in equation 1. Each node in the tree represents an element of the vector $s_R$ where $$s_R = \begin{bmatrix} \text{real}\{s\} \\ \text{imag}\{s\} \end{bmatrix}$$

We may calculate partial Euclidean distances by calculating various elements of the vector s, but the vector need not be complete before we decide to remove (or "prune") a node in the tree from further search. Nodes that are estimated to have a low likelihood of being part of the vector representing the possibly transmitted signal with the minimum distance to the received signal are pruned. Additionally, because the distances are non-negative, once we decide to prune a node from search, we may prune all successor nodes without further calculation or storage. We may do so because any node connected to the removed ancestor node will be farther away from the received signal, and consequently not a candidate for the signal actually sent. Hence, we need not waste computing resources calculating or storing these pruned nodes and leaves. However, by doing so, our results are only as certain as our likelihood estimation.

Figure 6:
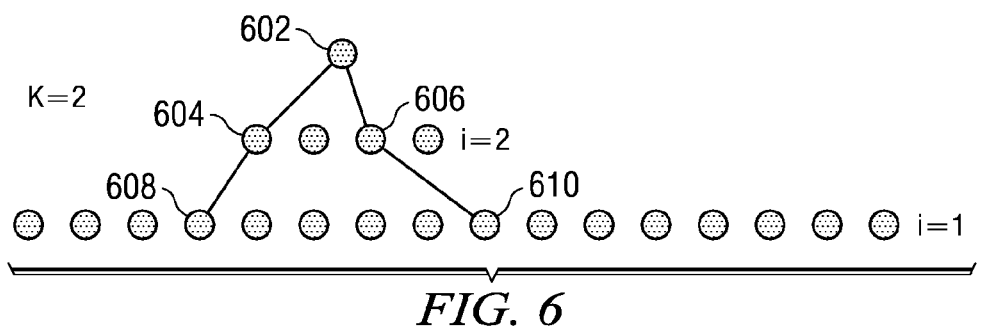
FIG. 6 illustrates a K-best breadth-first search in accordance with some embodiments of the present disclosure.

FIG. 6 illustrates a K-best breadth-first tree traversal algorithm for pruning that implements the decoding. Each node in the tree represents real or imaginary part of a possibly transmitted QAM signal. The number of branches per node is the square root of the QAM size for the real search. For example, 16-QAM results in each node having four branches. Beginning at root node 602, the distance to each of the four nodes on the level below it are calculated. This illustrates the breadth-first aspect of the method, i.e., distances for nodes on the same row are calculated before distances for nodes on another row are calculated. For K=2, the nodes corresponding to the two smallest distances are selected: nodes 604 and 606. These nodes are named survivor nodes because they are the only nodes to escape pruning. This illustrates the K-best aspect of the method, i.e., the number K represents the amount of survivor nodes. The value for K may be selected, adjusted as needed, and optimized via simulation. Next, from each survivor node, the distance to each of 4 corresponding nodes on the level below it are calculated, and the K-best selection process continues until the leaf row is reached. For illustration purposes, the node tree depicted is small.

At the leaf row, all survivor nodes are used for log-likelihood-ratio ("LLR") computation. Because we are not absolutely certain that we have not pruned the signal actually sent, K is preferably sufficiently large to provide performance on par with maximum-likelihood performance, which would not prune the node with the smallest distance during the search.

Figure 7:
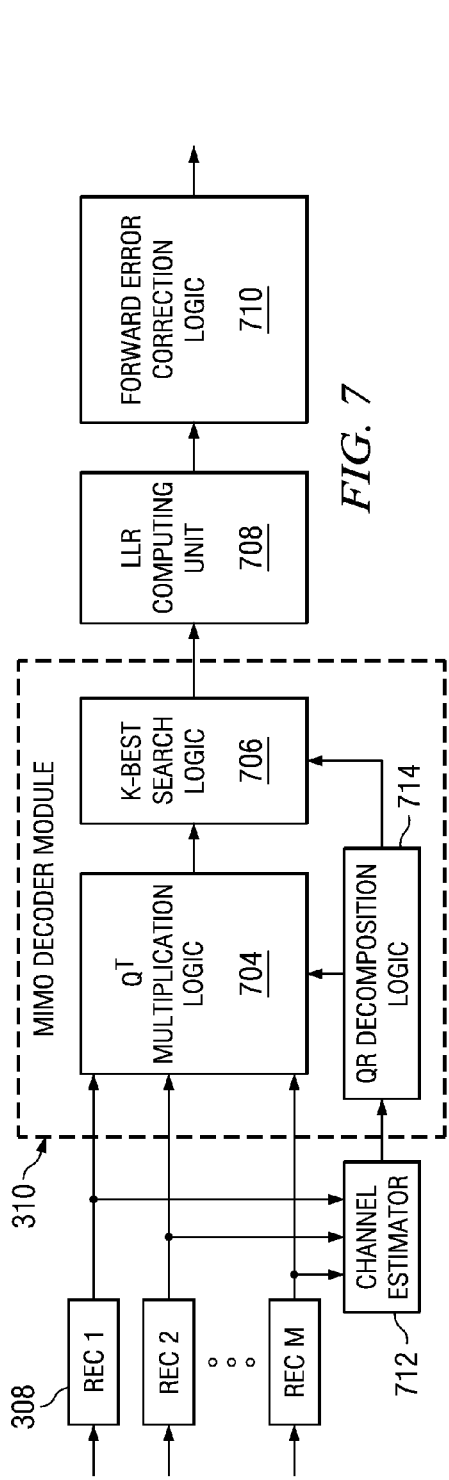
FIG. 7 is a block diagram of a decoder module and other connections in accordance with some embodiments of the present disclosure.

Turning to FIG. 7 and one implementation of the K-best, breadth-first search algorithm described above, data from the receive transceivers 308 are sent to a channel estimator 712 before entering the decoder module 310. The channel estimator 712 helps ensure proper equalization, i.e., compensation for phase and amplitude introduced due to wireless multipath channel. The channel estimator 712 also supplies the decoder module 310 with the matrix H. Computation of $\|y-Hs\|^2$ could be rewritten as $$\|y-Hs\|^2 = \left\| \begin{bmatrix} real\{y\} \\ imag\{y\} \end{bmatrix} - \begin{bmatrix} real\{H\} & -imag\{H\} \\ imag\{H\} & real\{H\} \end{bmatrix} \begin{bmatrix} real\{s\} \\ imag\{s\} \end{bmatrix} \right\|^2$$

$$= \|y_R - H_R s_R\|^2,$$

where $y_R$ is $2 M_R \times 1$ real domain representation of received input vector given by $$y_R = \begin{bmatrix} real\{y\} \\ imag\{y\} \end{bmatrix},$$

$H_R$ is the $2M_R \times 2M_T$ real domain representation for the channel matrix H where $$H_R = \begin{bmatrix} real\{H\} & -imag\{H\} \\ imag\{H\} & real\{H\} \end{bmatrix}$$

and $s_R$ is $2M_T \times 1$ real domain representation of transmitted vector given by $$s_R = \begin{bmatrix} real\{s\} \\ imag\{s\} \end{bmatrix},$$

The matrix $H_R$ is then decomposed by QR decomposition logic 714 into matrices Q and R. Q is $2M_R \times 2M_T$, and has orthonormal columns. R is $2M_T \times 2M_T$, and upper triangular, i.e., all elements below the main diagonal are zero. Q and R are calculated such that $$H_R = Q \begin{bmatrix} R \\ 0 \end{bmatrix} = [Q_1 \ Q_2] \begin{bmatrix} R \\ 0 \end{bmatrix}, \quad (3)$$

where 0 is a $(2M_R-2M_T) \times 2M_T$ zero matrix, $Q_1$ is a $2M_R \times 2M_T$ matrix and $Q_2$ is a $2M_R \times (2M_R-2M_T)$ matrix. In order to mathematically prune nodes, a constraint may be placed on equation 2, $$d(s_R) = \|y_R - H_R s_R\|^2, \text{ where } d(s_R) < r^2, \quad (4)$$

thus pruning nodes farther away than a distance, r. Applying the decomposition result, equation (3), to equation (4):

$$\|y_R - H_R s_R\| < r^2, \quad (5)$$

$$\left\| Q^T y_R - \begin{bmatrix} R \\ 0 \end{bmatrix} s_R \right\|^2 < r^2, \quad (6)$$

$$\|Q_1^T y_R - R s_R\|^2 < r^2 - \|Q_2^T y_R\|^2, \quad (7)$$

$$c + \|Q_1^T y_R - R s_R\|^2 < r^2, \text{ and} \quad (8)$$

$$d(s_R) = c + \|\hat{y} - R s_R\|^2 \quad (9)$$

where $\hat{y} = Q_1^T y_R$. We can safely set c to be 0 because it is not a function of $s_R$. Note that $Q_1 = Q$, when $M_R = M_T$.

Multiplication logic 704 performs the multiplication by $Q_1^T$, and K-best search logic 706 implements the breadth-first search on the data. The logic 706 calculates the elements for the $s_R$ vector and the corresponding distance to each node by calculating a b-metric and a T-metric. The logic 706 calculates the b-metric and T-metric using $$b_{i+1} = \hat{y}_i - \sum_{j=i+1}^{2M_T} R_{ij} s_{R,j} \quad (10)$$

and $$T_i = T_{i+1} + |b_{i+1} - R_{ii} s_{R,i}|^2 \quad (11)$$

where $T_{2M_T} = 0$; $b_{2M_T} = \hat{y}_{2M_T}$; $T_1 = \|y_R - H_R s_R\|^2$, and i=node level number as depicted in FIG. 6.

The full distance $d(s_R)$ from the received signal to the possibly transmitted signal is the partial Euclidean distance of a leaf, so $d(s_R) = T_1(s_R)$. The approximated solution is the point corresponding to the lowest $T_1(s_R)$.

The log-likelihood-ratio ("LLR") computing unit 708 computes the bit decision reliability (soft-decision) of the K-best detection. Denoting the $k^{th}$ information bit as $x_k$, there exists a unique mapping between the bit sequence and the transmitted signal vector: $[x_1 \ldots x_{M_T log_2(Q)}]^T$=bit mapping(s), where Q is the QAM constellation size.

Equation (12) illustrates computation of the LLR based on survivor nodes.

$$LLR_k = \ln \frac{Pr\{x_k = 1 | y\}}{Pr\{x_k = 0 | y\}} \quad (12)$$

$$= \frac{1}{2\sigma^2} \left[ - \min_{\substack{s \in survived\ nodes \\ with\ x_k = 1}} \{\|y - Hs\|^2\} + \min_{\substack{s \in survived\ nodes \\ with\ x_k = 0}} \{\|y - Hs\|^2\} \right]$$

The computed LLRs are then supplied to forward error correction logic ("FEC") 710. The FEC 710 performs error correction analyzing the decision reliability of coded bit sequence.

After error correction, the solution is then provided to a user via a data stream. The data stream can take any number of formats such as image data, sound data, etc. The solution can also be a piece of information that the wireless device 108 uses to ultimately cause a data stream to be provided to a user. The solution can also be a piece of information that a data stream provided to the user is based on.

Preferably, the LLR computing unit 708 and forward correction logic 710 are not part of the MIMO decoder module 310. In an alternative embodiment, they are part of the MIMO decoder module 310.

Figure 8:
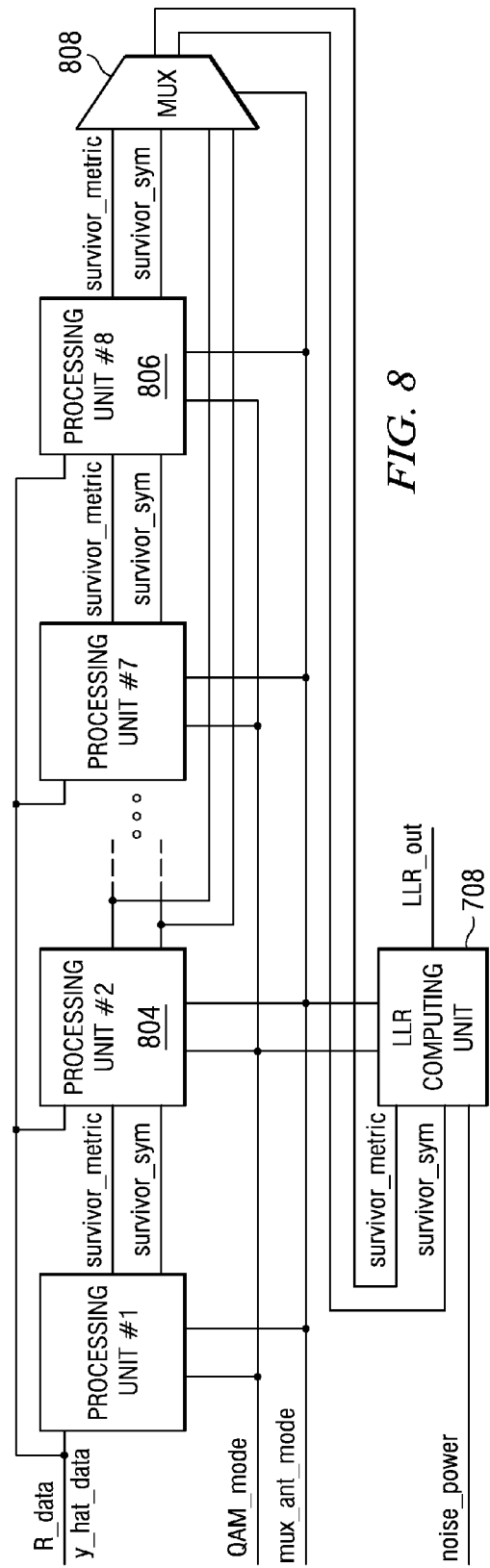
FIG. 8 is a block diagram of K-best breadth-first search logic ("K-best search logic") and other connections in accordance with some embodiments of the present disclosure.

FIG. 8 illustrates the architecture of the K-best breadth-first real search logic ("K-Best search logic") 706, for a 4×4 transceiver configuration, and its connection to the LLR computing unit 708. Each processing unit (e.g. 804) in the search logic processes one level of the node tree. Every two levels of the node tree correspond to the real and imaginary part of the partial Euclidean distances respectively. As such, for a 1×1 configuration the outputs for processing unit #2 804 are passed to the LLR 802 by a multiplexer ("MUX") 808. Similarly, 2×2 and 3×3 configurations correspond to processing units #4 and #6 respectively (not shown). For a 4×4 configuration, the outputs for processing unit #8 806 are passed to the LLR 802 by the MUX 808. Configuration information is passed to each processing unit via the wires such as the QAM_mode and ant_mode parameters. Other parameters may also be passed, allowing for custom parameterization. Each processing unit receives data about the R matrix from the QR decomposition logic 714 via the wire labeled R_data y_hat_data. Each processing unit also receives ŷ data from the multiplication logic 704. Preferably, the same wire delivers both pieces of data to each processing unit. In an alternative embodiment, separate wires are used. Some processing units also receive survivor metric and survivor symbol information as inputs via the wires labeled survivor_metric and survivor_sym. The MUX 808 supplies the LLR computing unit 802 with the ultimate survivor metric and symbol based on the configuration information.

Figure 9:
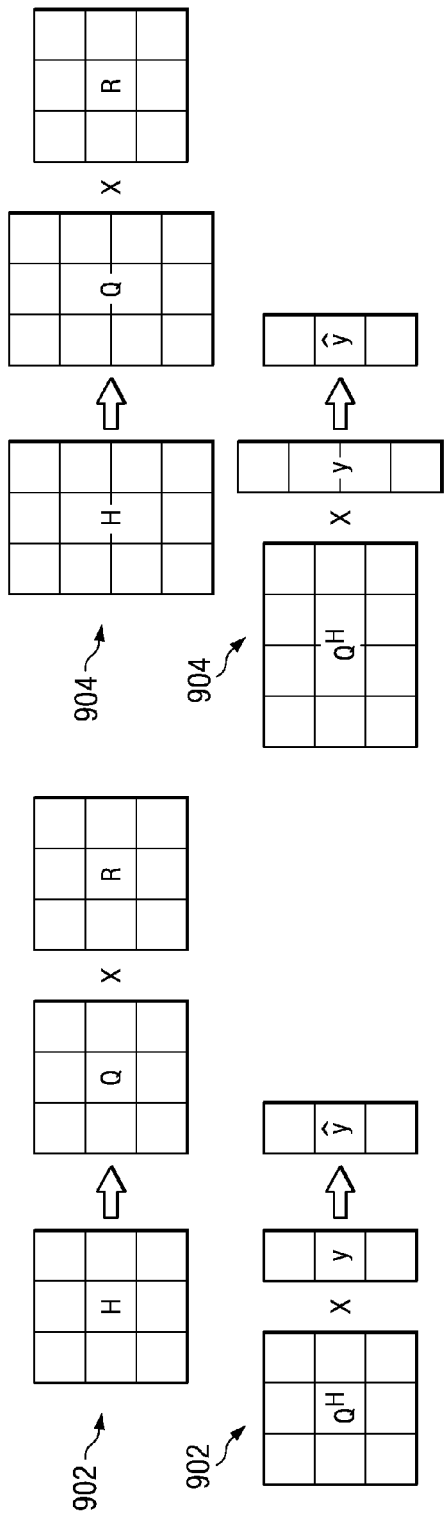
FIG. 9 illustrates how the sizes of various matrices change due to an addition of a transceiver to the system in accordance with some embodiments of the present disclosure.

FIG. 9 illustrates the ability to map non-square configurations to an equivalent square configuration using the QR decomposition as long as $M_T$ is less than or equal to $M_R$. For example, in the 3×3 scenario 902, the decomposition results in a 3×3 matrix R and 3×1 vector ŷ. However, in the 4×3 scenario 904 (representing an added transceiver), the decomposition results in a 3×3 R and a 3×1 ŷ as well. Hence, no modification to the search logic need be made when a input or output source is added or removed as long as $M_T$ is less than or equal to $M_R$. In addition, because each processing unit can process QPSK, 16-QAM, and 64-QAM, among other modulation methods, the designed architecture can support any combination of transceiver configurations.

Figure 10:
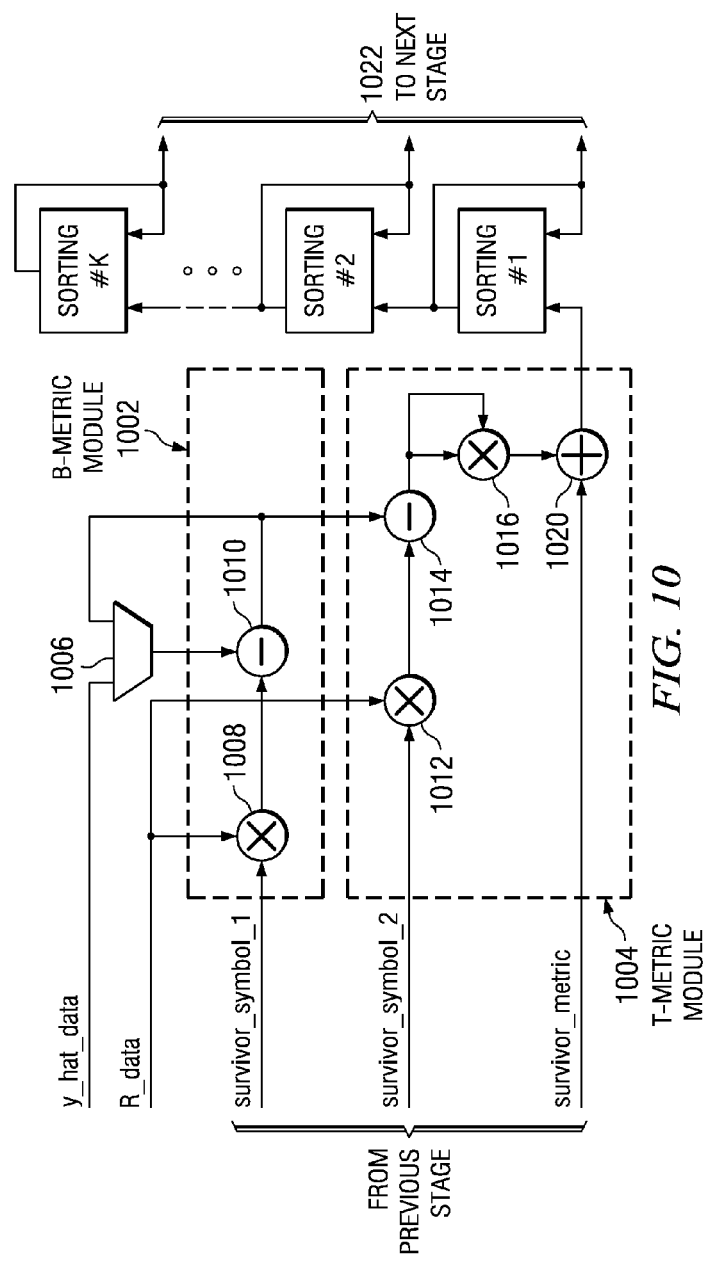
FIG. 10 is a block diagram of a processing unit in accordance with some embodiments of the present disclosure.

FIG. 10 is a block diagram of a processing unit explicitly showing the logical calculation of the b-metric and T-metric via the b-metric module 1002 and the T-metric module 1004 as described in equations 10 and 11. Considering the b-metric module 1002 first, ŷ data is input into MUX 1006. R data ($R_{ij}$) is multiplied with survivor symbol data ($s_{R,i}$) at 1008 before being subtracted from $\hat{y}_i$ to form the b-metric at 1010. The b-metric is then supplied to the MUX 1006 as feedback, and supplied to the T-metric module 1004. The T-metric module 1004 multiplies R data ($R_{ij}$) with $s_R$ data ($s_{R,i}$) at 1012. The $s_R$ data is preferably provided via a look-up table (not shown). The product is subtracted from the b-metric at 1014. The difference is then squared at 1016. The square is then added to the previous survivor metric ($T_{i+1}$) at 1020.

The T-metric is then passed to K number of sorting units 1022, K representing the number of survivor nodes. By adding more sorting units 1022, we can increase the value of K, thus making the processing unit scalable. Initially, all the registers in the sorting units are set to the maximum possible value. At each incoming metric, the larger value of the two inputs is passed to the next sorting unit while the smaller one is stored at the current sorting unit.

Figure 11:
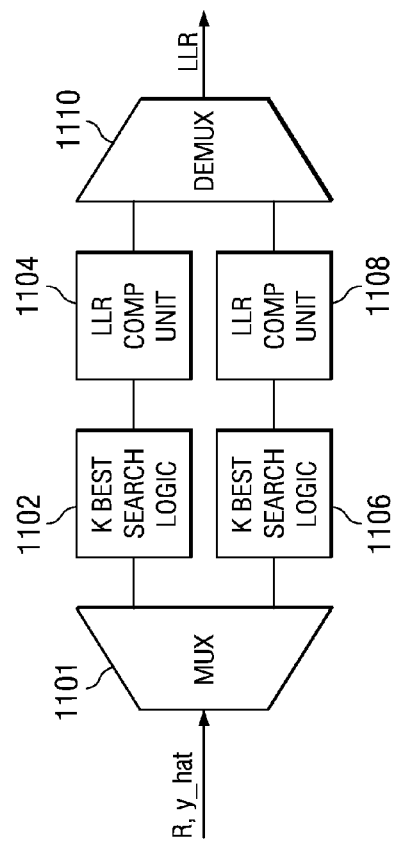
FIG. 11 illustrates parallel K-best search logic architecture in accordance with some embodiments of the present disclosure.

FIG. 11 illustrates the architecture for parallel search logic, an alternative embodiment, to increase the throughput of the K-best search. This architecture doubles throughput without scaling clock speed by adding another K-best search logic 1106 and LLR computing unit 1108 parallel to a first K-best search logic 1102 and LLR unit 1104. R and ŷ data are input into the MUX 1101, and supplied to either parallel branch. DEMUX 1110 then outputs the LLR data. This parallelization can occur more than once.

Figure 12:
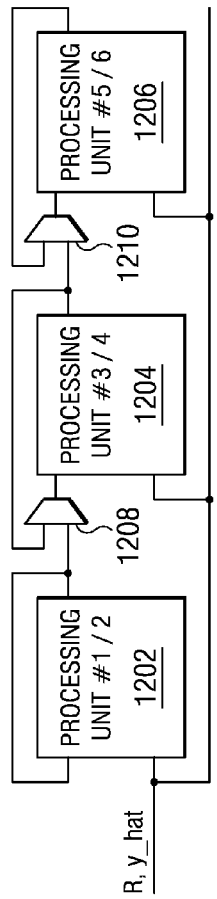
FIG. 12 illustrates folded processing unit architecture in accordance with some embodiments of the present disclosure.

FIG. 12 illustrates the architecture for folded processing units, an alternative embodiment. This architecture halves the throughput, but reduces area complexity. Each unit 1202-1206 processes two levels of the node tree by feeding its output back into its input once. For example, after the processing unit 1202 finishes calculating the b-metric and T-metric as described above, the output is fed back into the same processing unit 1202, and it calculates the next iteration of metrics. Only then does the output travel to the processing unit 1204. The MUXs 1208-1210 enable the processing units to select the correct input. In even further alternative embodiments, each processing unit is responsible for any number of iterations.

Figure 13:
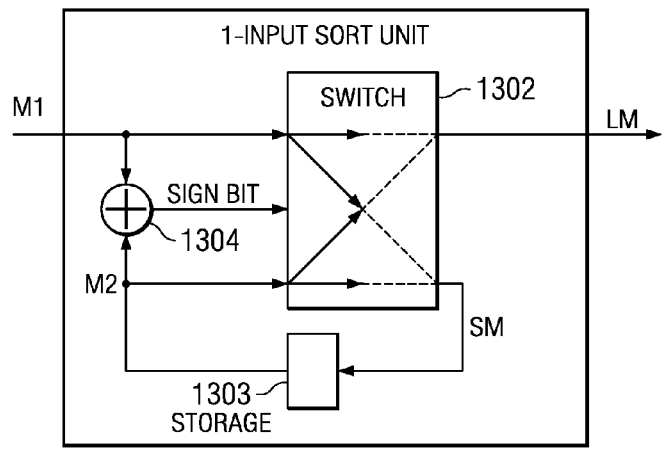
FIG. 13 illustrates a single-input sorting unit in accordance with some embodiments of the present disclosure.

FIG. 13 illustrates a sorting unit, specifically a single-input sorting unit. As discussed with FIG. 10, a switch comparator 1302 compares a metric ("M2") stored in storage 1303 with an incoming metric ("M1") preferably by subtracting them. The sign bit 1304 of the answer indicates which metric is larger, and the switch comparator 1302 forwards the larger metric ("LM") and routes the smaller metric ("SM") to storage 1303.

Figure 14:
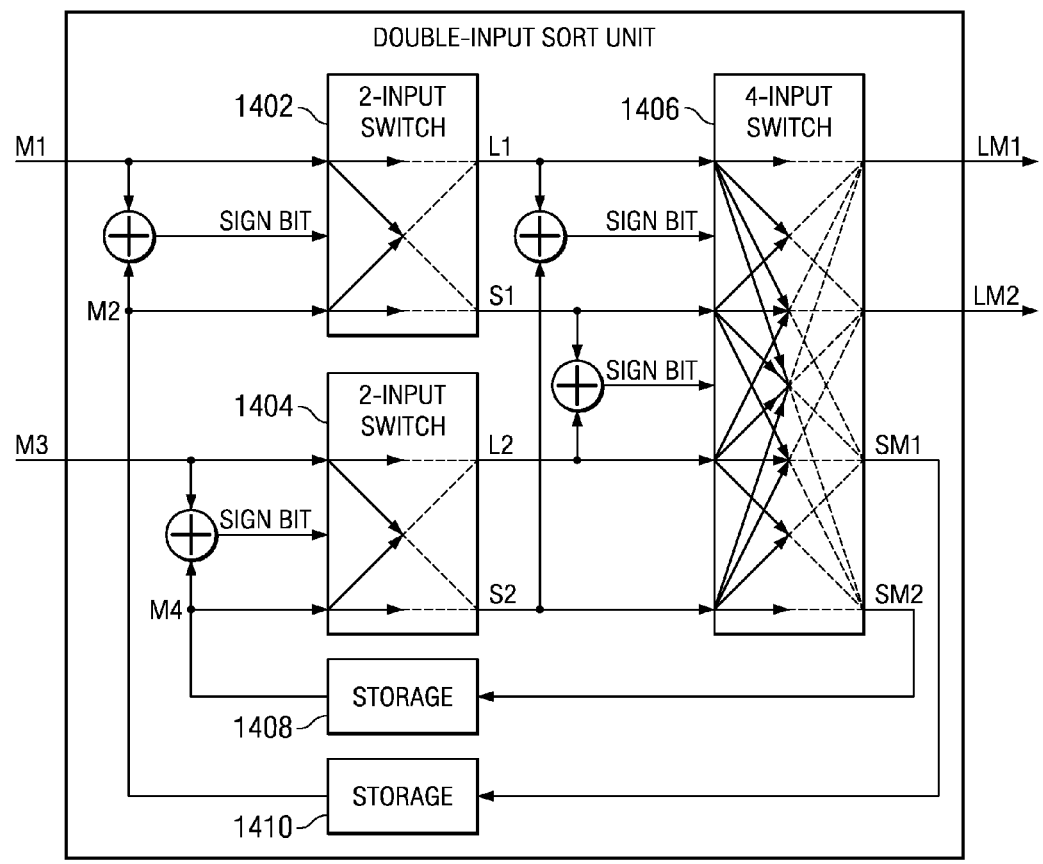
FIG. 14 illustrates a double-input sorting unit in accordance with some embodiments of the present disclosure.

FIG. 14 illustrates a double-input sorting unit for increased throughput, an alternative embodiment. Here, M1 and M3 are input metrics and M2 and M4 are stored metrics. First, M1 and M2 are compared via a 2-input switch comparator 1402, the larger metric being L1 and the smaller metric being S2. Next, M3 and M4 are compared via another 2-input switch comparator 1404, the larger metric being L2 and the smaller metric being S2. Finally, the outputs of the first two comparisons are input into a 4-input switch comparator 1406 resulting in LM1 and LM2, the two largest metrics, being forwarded, and SM1 and SM2, the two smallest metrics, being stored 1408, 1410. However, because the sort preferably occurs in two stages, critical path delay will increase.

FIG. 15 illustrates a high-speed double-input sorting unit for increased throughput with the same critical path delay as a single-input sorting unit. In order to select two smaller and larger metrics, 6 comparisons are preferably taken simultaneously:

X1=MSB {M1-M2},

X2=MSB {M1-M3},

X3=MSB {M1-M4},

X4=MSB {M2-M3},

X5=MSB {M2-M4}, and

X6=MSB {M3-M4}, where if the most significant bit ("MSB") of the difference of A and B equals 1, then A is less than B (if MSB {A−B}=1, then A<B). Hence, if X2=1, X3=1, X4=1, and X5=1, then M1 and M2 are the two smallest metrics.
If X1=1, X3=1, X4≠1, and X6=1, then M1 and M2 are the two smallest metrics.
If X1=1, X2=1, X5≠1, and X6≠1, then M1 and M2 are the two smallest metrics.
If X1≠1, X2≠1, X5=1, and X6=1, then M1 and M2 are the two smallest metrics.
If X1≠1, X4=1, X3≠1, and X6≠1, then M1 and M2 are the two smallest metrics.

Otherwise, M3 and M4 are the two smallest metrics. Such an algorithm is programmed into the control logic 1502, which supplies switch comparator 1504 with the necessary routing information. Specifically, the largest metrics, LM1 and LM2, are output from the sorting unit, while the smallest metrics, SM1 and SM2 are stored in storage 1506 and 1508 respectively. Exclusive use of these high-speed sorting units enables a reduction of the total number of sorting units to K/2.

FIG. 16 illustrates a method of implementing one embodiment of the algorithm described above. After beginning at 1602, data is received from the receive transceivers at 1604. Next, a K-best breadth-first search is performed to obtain an estimation of which constellation point was sent at 1606. Next, at 1608, the user is provided with a data stream based at least in part on the estimate before the end is reached at 1610. Two or more of the various actions depicted can be combined together and performed simultaneously. Furthermore, the order can be reversed.

The system described above may be implemented on a wireless device such as any general-purpose computer. FIG. 17 illustrates a typical, general-purpose computer system 1780 suitable for implementing one or more embodiments disclosed herein. In various embodiments, the storage 1784 comprises volatile memory (e.g., random access memory), non-volatile storage (e.g., Flash memory, hard disk drive, CD ROM, etc.), and combinations thereof. The storage 1784 comprises software that is executed by the processor 1782. One or more of the actions described herein are performed by the processor 1782 during execution of the software.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be coupled through some interface or device, such that the items may no longer be considered directly coupled to each other but may still be indirectly coupled and in communication, whether electrically, mechanically, or otherwise with one another. Other examples of changes, substitutions, and alterations are ascertainable by one skilled in the art and could be made without departing from the spirit and scope disclosed herein.

What is claimed is:

1. A hardware device comprising:
 a multiple-input multiple-output first decoder processor; and
 a first log-likelihood-ratio processing unit coupled to the first decoder processor,
 wherein the first decoder processor comprises at least one processing unit and at least one sorting unit, wherein the processing unit comprises:
 a first T-metric processor that calculates a T-metric; and
 a first b-metric processor that calculates a b-metric;
 wherein the first decoder processor uses a K-best, real domain channel representation, breadth-first search method to decode data from multiple-input multiple-output sources.

2. The device of claim 1, wherein the data is modulated using 16-QAM, 64-QAM, or quadrature phase shift keying alone or in combination.

3. The device of claim 1, wherein the log-likelihood-ratio processing unit computes log likelihood-ratios from results of the search using an approximation.

4. A method implemented in hardware comprising:
 receiving data, via a receiver, representing a vector of receive signal samples detected by multiple receive transceivers;
 calculating in a processor a T-metric; and
 calculating in a processor a b-metric;
 performing a K-best, breadth-first search on the data to obtain an estimated constellation point comprising decoding the data using scalable processor units and the results of the calculating steps; and
 providing a user with a data stream based at least in part on the estimated constellation point.

5. The method of claim 4, wherein performing the search comprises:
 using at least one high-speed double-input sorting unit that does not increase critical path delay.

6. The method of claim 4, further comprising processing log-likelihood-ratios from the results of the search using an approximation.

7. A mobile device comprising:
 a multiple-input multiple-output decoder comprising a plurality of scalable processing units;, wherein the multiple-input multiple-output decoder is configured to perform a K-best, breadth-first search as part of converting a receive signal into a data stream provided to a user;
 a first log-likelihood-ratio processing unit coupled to the decoder, wherein the decoder comprises at least one processing unit and at least one sorting unit, wherein the processing unit comprises:
 a first T-metric processor that calculates a T-metric; and
 a first b-metric processor that calculates a b-metric;
 wherein the decoder uses a K-best, real domain channel representation, breadth-first search method to decode data from multiple-input multiple-output sources.

8. The device of claim 7, wherein the decoder decodes data using folded processing units.

9. The device of claim 7, wherein the at least one sorting unit is an high-speed double-input sorting unit that does not increase critical path delay.

10. The device of claim 1, wherein the processing unit is scalable, paralleliziable, and parameterizable.

11. The device of claim 1, wherein a user is provided a data stream based at least in part on decoded data decoded by the first decoder module.

12. The device of claim 1, further comprising K sorting units per processing unit.

13. The device of claim 1, wherein the at least one sorting unit is a high-speed double-input sorting unit that does not increase critical path delay.

14. The device of claim 13, further comprising K/2 sorting units per processing unit.

15. The device of claim 1, further comprising a multiple-input multiple-output second decoder processor coupled to a second log-likelihood-ratio processing unit, which are in parallel with the first decoder processor and the first log-likelihood-ratio processing unit.

16. The device of claim 1, wherein the processing units are folded.

17. The device of claim 1, wherein one or more input, output, or combination of input and output sources are added, removed, or altered during data processing without disturbing results of the search.

* * * * *